United States Patent [19]

Kubota et al.

[11] Patent Number: 4,801,044
[45] Date of Patent: Jan. 31, 1989

[54] CHIP SEPARATION AND ALIGNMENT APPARATUS

[75] Inventors: Shigeru Kubota, Tokyo; Shoji Kanou, Yokohama; Masahiro Kubo, Sagamihara, all of Japan

[73] Assignee: Nitto Kogyo Kabushiki Kaisha, Tokyo, Japan

[21] Appl. No.: 54,497

[22] Filed: May 27, 1987

[30] Foreign Application Priority Data

| May 27, 1986 [JP] | Japan | 61-121799 |
| Nov. 17, 1986 [JP] | Japan | 61-273682 |
| Mar. 12, 1987 [JP] | Japan | 62-57649 |

[51] Int. Cl.⁴ .................... B23Q 7/12; B65H 3/08
[52] U.S. Cl. .................... 221/163; 221/197; 221/202; 221/200; 221/264; 221/278; 366/107; 406/137
[58] Field of Search ............... 221/278, 168, 163, 200, 221/202, 156, 233, 264, 197; 366/101, 106, 107; 406/137, 136, 138, 88

[56] References Cited

U.S. PATENT DOCUMENTS

| 575,136 | 1/1897 | Temler | 221/163 |
| 3,410,452 | 10/1968 | Igel et al. | 221/197 X |
| 3,893,691 | 7/1975 | Kearney et al. | 221/278 X |
| 3,963,456 | 6/1976 | Tsuchiya et al. | 221/264 X |
| 4,291,819 | 9/1981 | Heller et al. | 221/264 X |
| 4,325,495 | 4/1982 | Mokris | 366/106 X |
| 4,457,451 | 7/1984 | Ichikawa | 221/200 X |
| 4,460,108 | 7/1984 | Noda et al. | 221/197 X |
| 4,484,693 | 11/1984 | Fujita et al. | 221/225 X |
| 4,494,902 | 1/1985 | Kuppens et al. | 221/25 X |
| 4,657,158 | 4/1987 | Faes et al. | 221/197 X |

FOREIGN PATENT DOCUMENTS

| 174023 | 7/1952 | Fed. Rep. of Germany | 221/163 |
| 271187 | 10/1950 | Switzerland | 221/200 |
| 420433 | 9/1971 | U.S.S.R. | 221/233 |

*Primary Examiner*—Joseph J. Rolla
*Assistant Examiner*—Stephen Parker
*Attorney, Agent, or Firm*—Oblon, Fisher, Spivak, McClelland & Maier

[57] ABSTRACT

A chip separation and alignment apparatus capable of accurately and readily accomplishing separation and alignment of chips with a simple construction. The apparatus includes a chip separation and alignment section and a chip separation section. The chip separation and alignment section includes a chip cassette formed into a flat rectangular box-like shape, in which are formed a chip storage chamber, a chip alignment hole provided with an upper end opening through which the chip alignment hole is communicated with a lower portion of the chip storage chamber and a lower end opening, and at least one air ejection port arranged near the upper end opening to intermittenly eject air therethrough. The chip separation section is arranged at the lower end opening of the chip alignment hole to separate chips one by one and to successively supply the separated chips to a subsequent step.

3 Claims, 14 Drawing Sheets

FIG. 2(a)    FIG. 2(b)
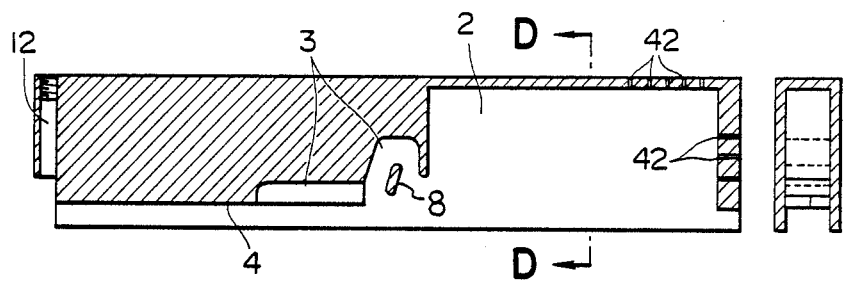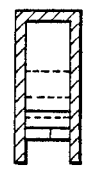
FIG. 2(c)
FIG. 3
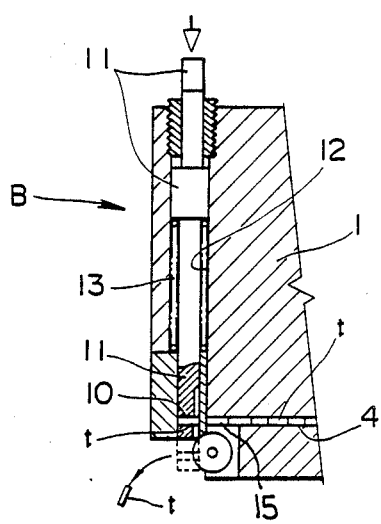

(a)

(b)

(a)

(a)

(a)

(b)

FIG. 14(a)
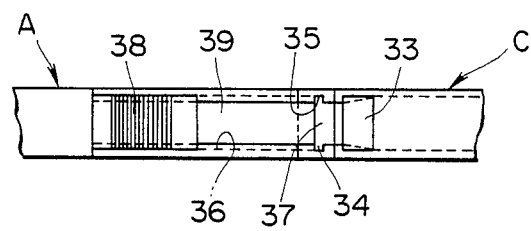
FIG. 14(b)    FIG. 14(c)
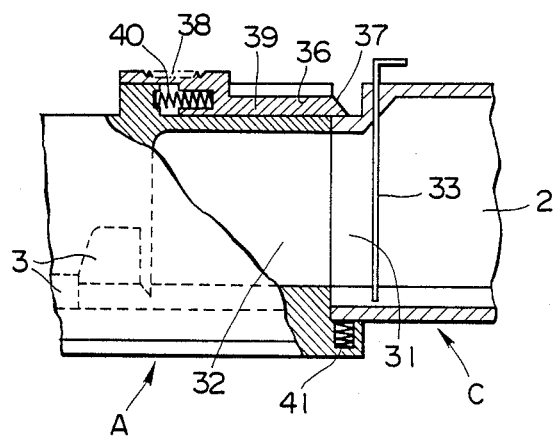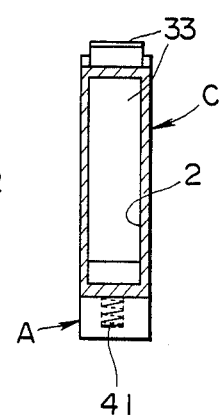

FIG. 15 (a)
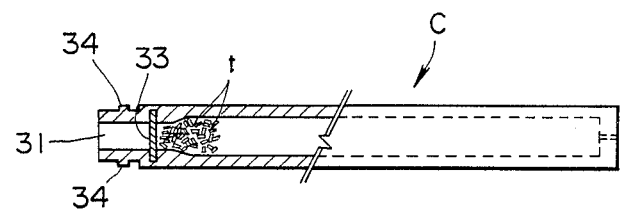
FIG. 15 (c)
FIG. 15 (b)
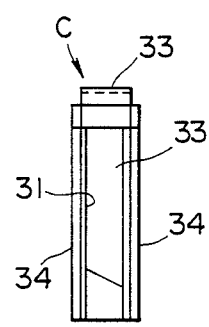
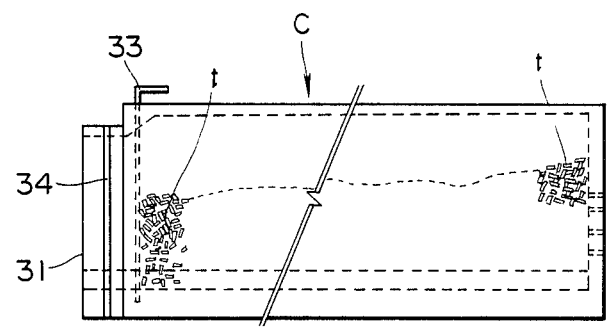

CHIP SEPARATION AND ALIGNMENT APPARATUS

BACKGROUND OF THE INVENTION

1. Field of the Invention

This invention relates to a chip separation and alignment apparatus, and more particularly to a chip separation and alignment apparatus which is adapted to separate a number of chips charged in a chip storage chamber utilizing air intermittently ejected and concurrently align them or arrange them in a row in a chip alignment hole to successively feed the aligned chips one by one from a head of the row.

2. Description of the Prior Art

Recently, techniques of mounting a wide variety of and a large number of chips such as small-sized rectangular and cylindrical electronic circuit elements on printed circuit boards have been extensively improved. For the mounting, various automatic chip mounting apparatus are used each of which is adapted to carry circuit elements onto a printed circuit board and mount the former on the latter. As a part of such an automatic chip mounting apparatus or a pre-apparatus of the mounting apparatus a chip separation and alignment apparatus is used which is adapted to arrange a number of chips in a row and successively feed them one by one.

A chip separation and alignment apparatus which has been conventionally used for such a purpose is typically classified into a tape cassette-type and a hopper-type as illustratively shown in FIGS. 7 and 8, respectively.

A chip separation and alignment apparatus of the tape cassette-type, as shown in FIG. 7, is constructed to set a reel 104 having a chip tape 103 wound thereabout in a cassette. The chip tape 103 comprises a paper tape body 101 having a plurality of holes formed therethrough at equal intervals and each charged therein with a chip t and a cover tape element 102 arranged to cover an upper surface of the tape body 101. Then, the cassette is mechanically operated to cause the chip tape 103 set in the cassette to be intermittently dispensed by a distance corresponding to a length of one chip along guides of a guide rail 105, and concurrently the cover tape element 102 is peeled from the tape body 101, so that the chips t exposed one by one at a distal end of the guide rail 105 may be successively held on a suction head or the like controlled by a computer and then moved onto a printed circuit board for mounting. The tape cassette is constructed into a flat shape so as to have a thickness slightly larger than that of the reel 104. Several tens or hundreds of such tape cassettes are removably and exchangably arranged.

Unfortunately, the chip separation and alignment apparatus of the tape cassette-type requires a large space for arranging a number of the tape cassettes therein. Another disadvantage encountered with the apparatus is that the chip tape is wasteful because of being disposable. The apparatus exhibits a further problem that an additional step of carrying the chips on the paper tape body is required, and a structure for feeding and extracting the chips one by one must be employed.

A chip separation and alignment apparatus of the hopper-type, as shown in FIG. 8, includes a plurality of hoppers 107 of a cylindrical or rectangular shape arranged on a base 106. The hoppers 107 each have a separation pipe 108 inserted thereinto through a center of a lower surface thereof. In the so-constructed apparatus, either the hopper 107 (base 106) or the separation pipe 108 is vertically moved to vertically move a distal end of the separation pipe 108 in relation to chips t to successively introduce the chips t in the separation pipe 108 to vertically arrange them in a row in the pipe 108. The so-aligned chips t are separated from each other one by one by means of a suitable separation structure to be subsequently supplied to a subsequent apparatus such as a multi-type automatic chip mounting apparatus.

The chip separation and alignment apparatus of the hopper-type has a disadvantage of requiring a large space for installing the hoppers. Another disadvantage encountered with the apparatus is that the number and location of hoppers to be installed are restricted because the hoppers or separation pipes must be vertically moved at the same time. A further problem of the apparatus is to render separate control of the hoppers substantially impossible because a plurality of the hoppers or separation pipes are simultaneously actuated.

OBJECTS OF THE INVENTION

The present invention has been made in view of the foregoing disadvantages of the prior art.

Accordingly, it is an object of the present invention to provide a chip separation and alignment apparatus which is capable of positively accomplishing separation and alignment of chips with a highly simple structure which essentially requires only a chip storage chamber, a chip alignment hole, and an air ejection port.

It is another object of the present invention to provide a chip separation and alignment apparatus which is capable of accurately separating chips one by one with a very high speed.

It is a further object of the present invention to provide a chip separation and alignment apparatus which is capable of permitting a cartridge-type chip case to be exchangable while a chip separation and alignment section is mounted on a base, to thereby readily and rapidly accomplish exchanging operation of chips.

SUMMARY OF THE INVENTION

In accordance with the present invention, a chip separation and alignment apparatus is provided. The apparatus comprises a chip separation and alignment section which comprises a chip cassette formed into a flat rectangular box-like shape. The chip cassette is formed therein with a chip storage chamber, a chip alignment hole provided with an upper end opening through which the chip alignment hole is communicated with a lower portion of the chip storage chamber and a lower end opening, and at least one air ejection port arranged near the upper end opening to intermittently eject air therethrough. The apparatus further comprises a chip separation section arranged at the lower end opening of the chip alignment hole to separate chips one by one and successively supply the separated chips to a subsequent step.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout, wherein:

FIG. 2 is an exploded view showing a chip cassette employed in the embodiment of FIG. 1, wherein FIG. 2(a) is a vertical sectional view showing a side of the chip cassette on which a storage chamber is formed, FIG. 2 (b) is a sectional view taken along line D—D of FIG. 2(a) and FIG. 2(c) is a front elevation view showing a side of the chip cassette on which a chip alignment hole is formed;

FIG. 3 is an enlarged sectional view taken along line E—E of FIG. 1;

FIGS. 14(a), 14(b) and 14(c) are a front elevation view partly in section, a plan view and a side view showing a connection between a chip separation section and a cartridge-type chip case in a fourth embodiment of a chip separation and alignment apparatus according to the present invention, respectively;

FIGS. 15(a), 15(b) and 15(c) are a front elevation view, a plan view partly in section and a side view showing the cartridge-type chip case of FIG. 14, respectively;

DETAILED DESCRIPTION OF THE PREFERRED EMBODIMENTS

The First Embodiment

Figure 1A:
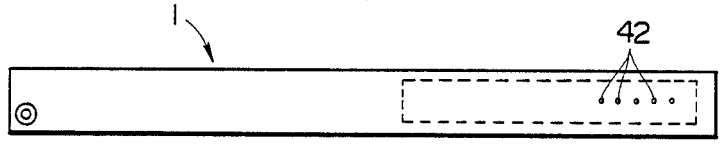
FIGS. 1(a) to 1(d) are a front elevation view, a plan view, a left side view and a right side view showing a first embodiment of a chip separation and alignment apparatus according to the present invention.
Figure 1B:
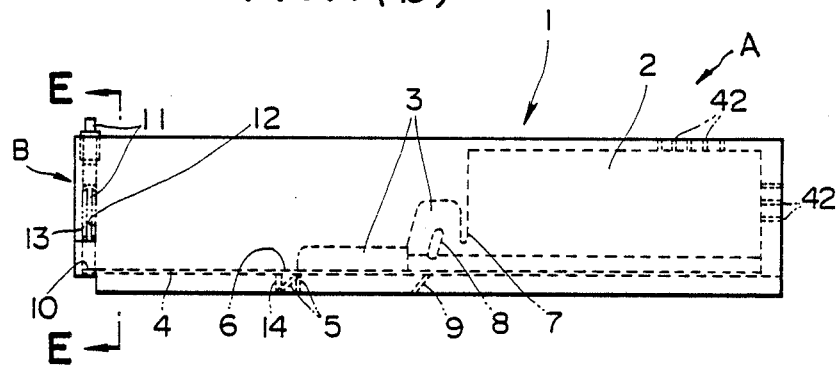
Figure 1C:
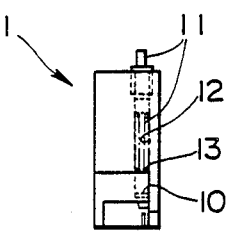
Figure 1D:
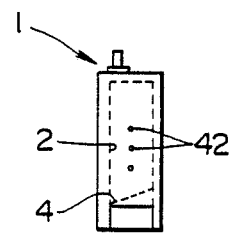

Now, a chip separation and alignment apparatus according to the present invention will be described hereinafter with reference to the accompanying drawings.

A first embodiment of a chip separation and alignment apparatus according to the present invention is shown in FIGS. 1 to 4.

A chip separation and alignment apparatus of the illustrated embodiment generally comprises a chip separation and alignment section. A and a chip separation section B. The separation and alignment section A includes a chip cassette 1 generally formed into a flat rectangular box-like shape. In the chip cassette 1 are formed a chip storage chamber 2, a secondary storage chamber 3 communicated with the chip storage chamber 2 and provided with a gate 7 and a control plate 8, a chip alignment hole 4 arranged below and communicated with the secondary storage chamber 3 and formed at upper and lower ends thereof with openings 6 and 15,) respectively, and an air ejection port 5 arranged adjacent to the upper end opening 6 of the chip alignment hole 4 to intermittently blow out or eject air therefrom. The upper end opening 6 of the chip alignment hole 4 is communicated with a bottom or a lower portion of the secondary storage chamber 3. The chip separation section B is arranged at the lower end opening 15 of the chip alignment hole 4 and functions to separate chips t one by one to feed them to a subsequent step.

Figure 4:
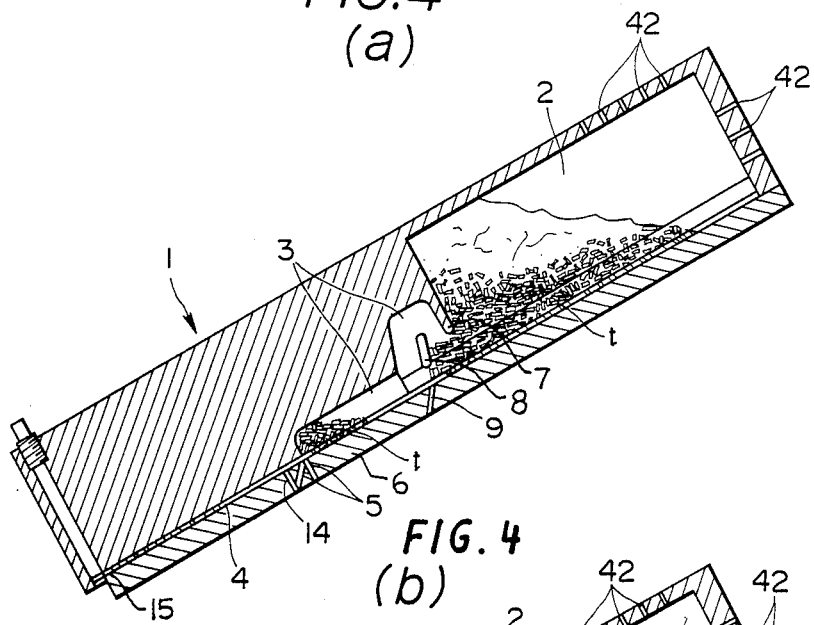
FIGS. 4(a) and 4(b) are schematic view showing separation of chips and separation and alignment of the chips by means of air ejected from each of air ejection ports of the chip cassette shown in FIG. 1.
Figure 4:
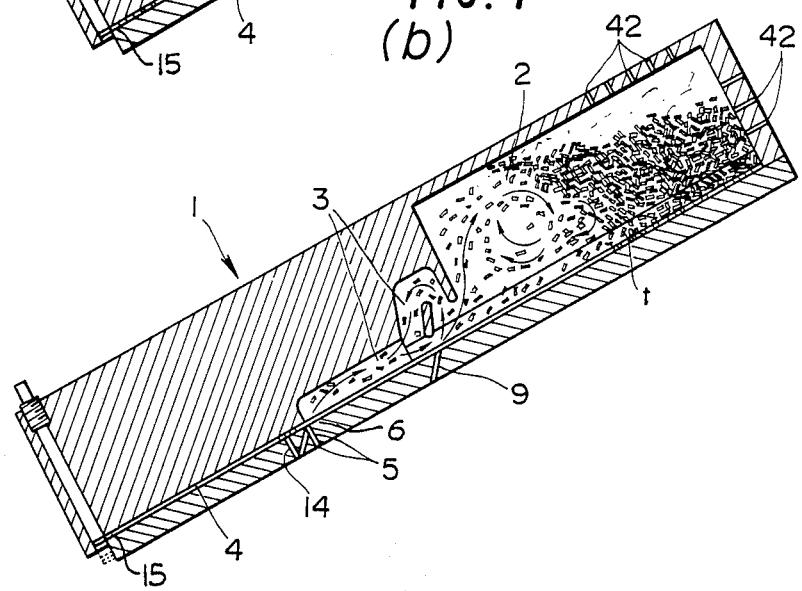
Figure 5:
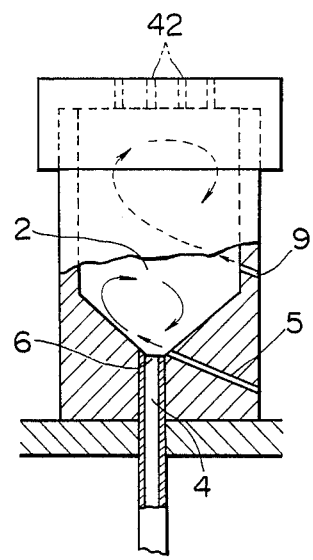
FIG. 5 is a partly cutaway sectional view showing a modification of the embodiment shown in FIG. 1.
Figure 6:
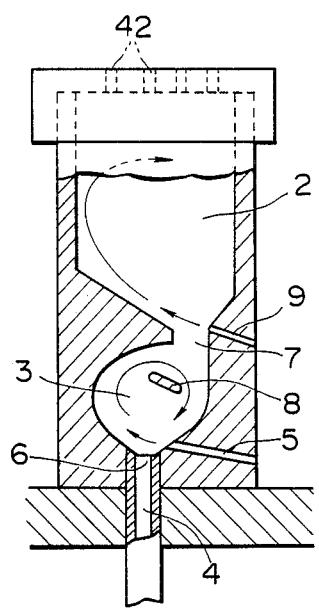
FIG. 6 is a partly cutaway sectional view showing another modification of the embodiment shown in FIG. 1.
Figure 7:
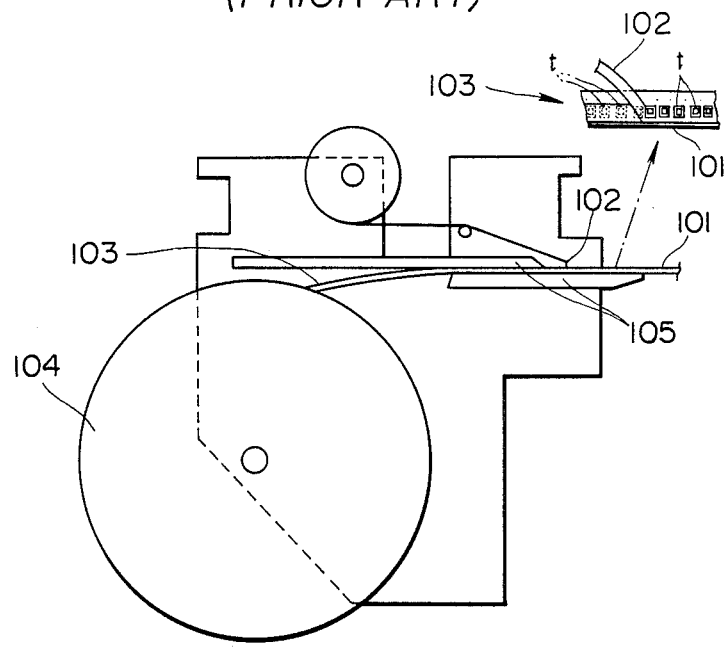
FIG. 7 is a front elevation view showing a conventional chip separation and alignment apparatus of the tape cassette-type.
Figure 8:
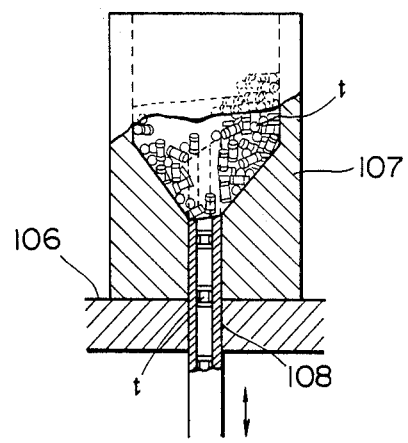
FIG. 8 is a front elevation view partly in section showing a conventional chip separation and alignment apparatus of the hopper-type.

The chip storage chamber 2 and the secondary chamber 3 each may be formed into a substantially conical or funnel-like shape by downwardly inclining or tapering at least a part of its inner surface so that the chips t may be downwardly slippedly moved by gravity and stored therein, as shown in FIGS. 5 and 6. Alternatively, this may be accomplished by arranging the chip cassette itself provided with the chambers 2 and 3 in a manner to be downwardly inclined, as shown in FIG. 4.

Arrangement of the gate 7 and the control plate 8 at the secondary storage chamber 3 shown in FIGS. 1, 2, 4, and 6 is to prevent that the chips t in the chip storage chamber 2 are densely superposed to excessively gather together near the upper opening 6 of the chip alignment hole 4 to a degree sufficient to hinder separation of the chips from one another by air ejected from the air ejection port 5.

As described above, the chip alignment hole 4 is provided with the upper end opening 6 communicated with a bottom or lower portion of the secondary storage chamber 3, and the air ejection port 5 is formed near the upper end opening 6 of the chip alignment hole 4 to intermittently eject air at predetermined time intervals (for example, at every several seconds). Additionally, the chip storage chamber 2 may be provided with another air ejection port 9 at a suitable position therein such as, for example, adjacent to the gate 7, so that separation of the chips t in the chip storage chamber 2 may be more fully attained.

The chip alignment hole 4 is formed into a shape corresponding to a shape (small rectangular shape, small cylindrical shape, or the like) and a size of the chip t or a sectional shape corresponding to a sectional shape of the chip t. For example, in FIG. 1, it is formed into a rectangular shape in section, whereas, in FIGS. 5 and 6, it is formed into a circular shape in section. Also, the chip alignment hole 4 is formed to have a length sufficient to permit a suitable number of (for example, about ten) such chips t which scatteringly entered the chip alignment hole 4 through the upper end opening 6 to be stored therein while being arranged in a row or aligned.

The chip alignment hole 4 is connected at a lower end portion thereof to the chip separation section B which is adapted to take out the aligned chips t one by one in order from the chip alignment hole 4 and feed them to a subsequent step.

In the illustrated embodiment, in addition to the air ejection ports 5 and 9 respectively provided near the upper end opening 6 of the chip alignment hole 4 and the gate 7, an additional air ejection port 14 is formed at a portion of an interior of the chip alignment hole 4 near the upper end opening 6. Reference numeral 42 designates air purge holes.

Now, the manner of operation of the chip separation and alignment apparatus of the illustrated embodiment constructed as described above will be described hereinafter.

A number of the chips (several hundreds to several thousands of such chips) t are received in the chip storage chamber 2. In the apparatus of FIG. 4, the chip cassette is inclinedly arranged (for example at an angle of 45°) whereas in the apparatus shown in each of FIGS. 5 and 6, it is erectly arranged. Then, pressurized air is intermittently ejected from the air ejection holes 5, 9, and 14 at predetermined time intervals. For example, the ejection may carried out for 1 second at every four seconds. This causes the chips t in the chip storage chamber 2 and those supplied through the gate 7 and control plate 8 to the secondary storage chamber 3 to be scatteringly separated and blown up or rotated into a whirlpool. Then, when the ejection is stopped, the chips t drop onto the lower portion or bottom of each of the storage chamber 2 and 3 by gravity to be accumulated thereon.

At this time, a large part of the chips t are intercepted by the gate 7 and control plate 8 to remain in the chip storage chamber 2, so that a slight number of the chips may drop into the secondary storage chamber 3. Of the so-dropping chips, ones which are positioned adjacent to the upper end opening 6 of the chip alignment hole 4 and postured in accord with the upper end opening 6 further drop into the chip alignment hole 4.

Repeating of the above described ejection of air from the air ejection ports causes a plurality of the chips to be alignedly stored in a row in the chip alignment hole 4, which are then separately taken out from a head of a row of the chips one by one in order and fed to a subsequent step such as an automatic chip mounting apparatus by the chip separation section B shown in FIG. 3.

In the illustrated embodiment, the chip separation section B is constructed in such a manner that a rod 11 which is provided at a lower end portion thereof with a groove 10 in which the foremost one of the chips t alignedly stored in the chip alignment hole 4 is fitted is arranged in a slide hole 12 while being upwardly forced by the elastic force of a spring 13, so that when an upper end portion of the rod 11 outwardly projected from the cassette is pushed down against the spring 13 by means of suitable external force, the chip t in the groove 10 may be discharged to an exterior of the cassette.

Air ejected from the air ejection ports 5 and 9 acts to scatteringly separate a number of the chips t densely superposed together in the storage chambers 2 and 3, and stop of the ejection causes the scatteringly separated chips to drop onto a position of the chip alignment hole 4 about the upper end opening 6 like a misty rain, so that they may be ready to enter the chip alignment hole 4.

Ejection of air from the air ejection ports 5 and 9 into interiors of the storage chambers 2 and 3 causes air in the chip alignment hole 4 to be sucked into the storage chambers to evacuate the chip alignment hole 4, resulting in the chips t stored in the chip alignment hole 4 being returned into the chambers 2 and 3 by suction. Ejection of air from the air ejection port 14 prevents such a trouble. More particularly, air emitted from the air ejection port 14 into the chip alignment hole 4 prevents the above-described suction of air in the chip alignment hole 4 into the storage chambers 2 and 3 to prevent the above-described suction of the chips t into the chambers and pushes down the chips stored in the chip alignment hole 4 downwardly or toward an outlet thereof to keep the chips closely aligned therein.

In the illustrated embodiment, vibration and oscillation actions are carried out in addition to the above-noted air ejection action, as required. The oscillation action promotes separation of the chips in the storage chambers 2 and 3, alignment of them in the chip alignment hole 4 and forward movement of them therein to ensure their close alignment therein. The oscillation action effectively accomplishes scattering separation of the chips in the storage chambers.

The Second Embodiment

Figure 9:
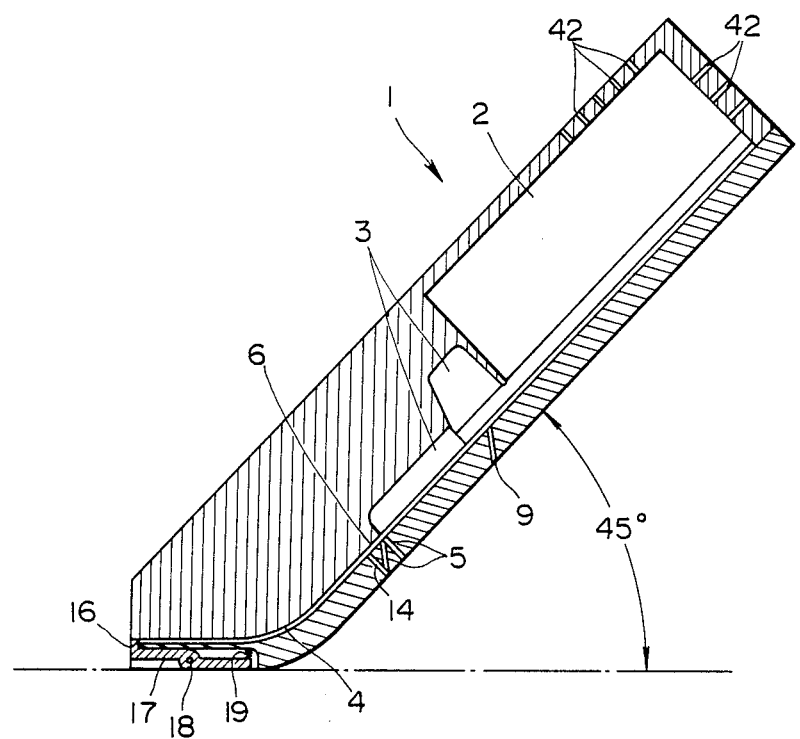
FIG. 9 is a sectional view showing a second embodiment of a chip separation and alignment apparatus according to the present invention.

Now, a second embodiment of a chip separation and alignment apparatus according to the present invention will be described with reference to FIGS. 9 and 10.

An apparatus of the second embodiment, as in the first embodiment, includes a chip cassette 1 generally formed into a flat rectangular box-like shape. In the chip cassette 1 are formed a chip storage chamber 2, a secondary storage chamber 3 communicated with the chip storage chamber 2 and having a gate 7 provided at a front portion thereof and a control plate 8 arranged therein, a chip alignment hole 4 arranged below and communicated with the secondary storage chamber 3 and formed at upper and lower ends thereof with openings 6 and 15, respectively, and an air ejection port 5 arranged adjacent to the upper end opening 6 of the chip alignment hole 4 to intermittently blow out or eject air therefrom. The upper end opening 6 of the chip alignment hole 4 is communicated with a bottom or a lower portion of the secondary storage chamber 3. The chip alignment hole 4 is arranged so is to be downwardly inclined or bent toward the lower end opening 15 at a predetermined angle (for example, 45°), so that when the chip cassette 1 is arranged at the same oblique angle (for example, 45°) as the chip alignment hole 4, a portion of the chip alignment hole 4 near the lower end opening 15 may be substantially horizontal, resulting in chips t being horizontally separately fed. Thus, removal of the chips one by one from the chip cassette 1 is linearly smoothly carried out by means of a chip separation section B.

Figure 10:
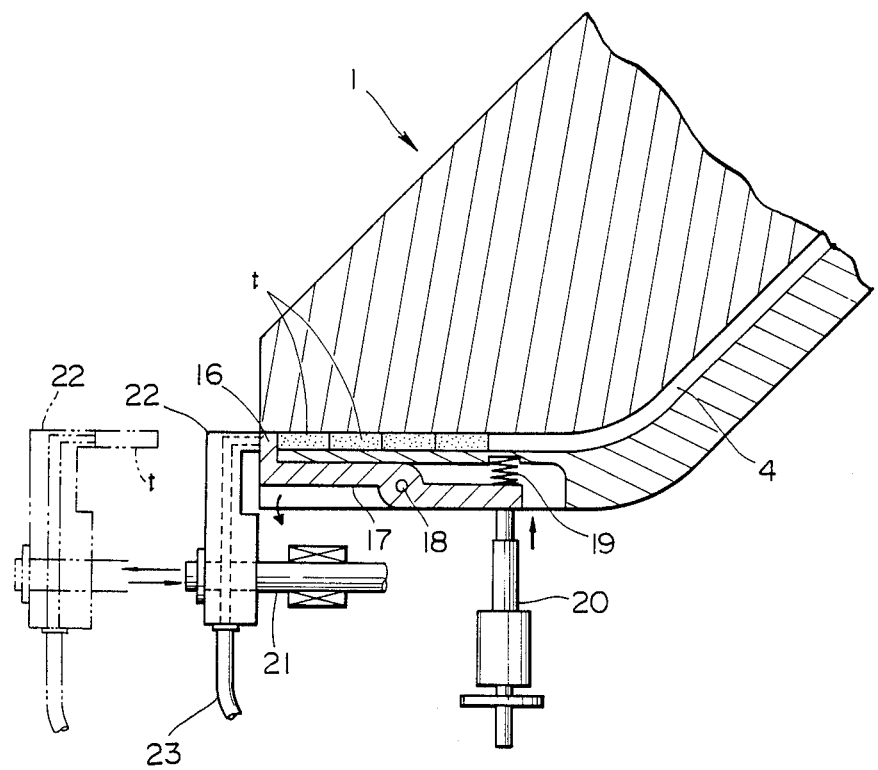
FIG. 10 is a partly enlarged sectional view showing a chip separation section in the apparatus of FIG. 9.

The chip separation section B, as shown in FIG. 10, includes a seesaw rod provided with a shutter and a vacuum-type chip suction head.

More particularly, a seesaw shaft 17 provided at a distal end thereof with a shutter 16 for operating the lower end opening 15 of the chip alignment hole 4 is pivotally mounted on a portion of the chip cassette 1 below the lower end opening 15 by means of a pivot pin 18. The seesaw shaft 17 is adapted to be pivotally moved about the pivot pin 18 by action of a spring 19 to close the lower end opening 15 of the chip alignment hole 4 with the shutter 16 to stop movement of the chips t in the chip alignment hole 4. Also, the seesaw shaft 17 is pivotally moved in the opposite direction against the spring 19 by external force exerted by a suitable means such as a solenoid 20 to open the lower end opening 15.

Also, the chip separation section B includes a vacuum-type chip suction head 22, which is mounted on an end of a rod 21 arranged in front of the lower end opening 15 operated by the shutter 16 so as to be linearly reciprocated by a predetermined distance by a suitable means such as, for example, a rotary cam, as indicated by arrows in FIG. 10. The chip suction head 22 holds only the foremost one of the chips t alignedly stored in the chip alignment hole 4 by suction when the shutter 16 is operated to open the lower end opening 15 and then is moved by the predetermined distance to separate the chip from a row of the chips. The chip suction head 22 is connected to a vacuum pipe 23 which is then connected to a vacuum source (not shown).

The Third Embodiment

Figure 11:
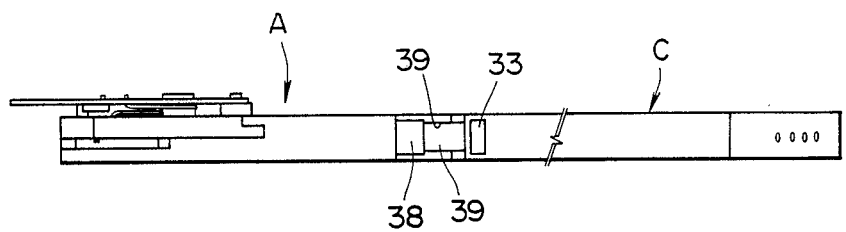
FIG. 11(a) and 11(b) are a front elevation view and a plan view showing a third embodiment of the present invention, respectively.
Figure 11B:
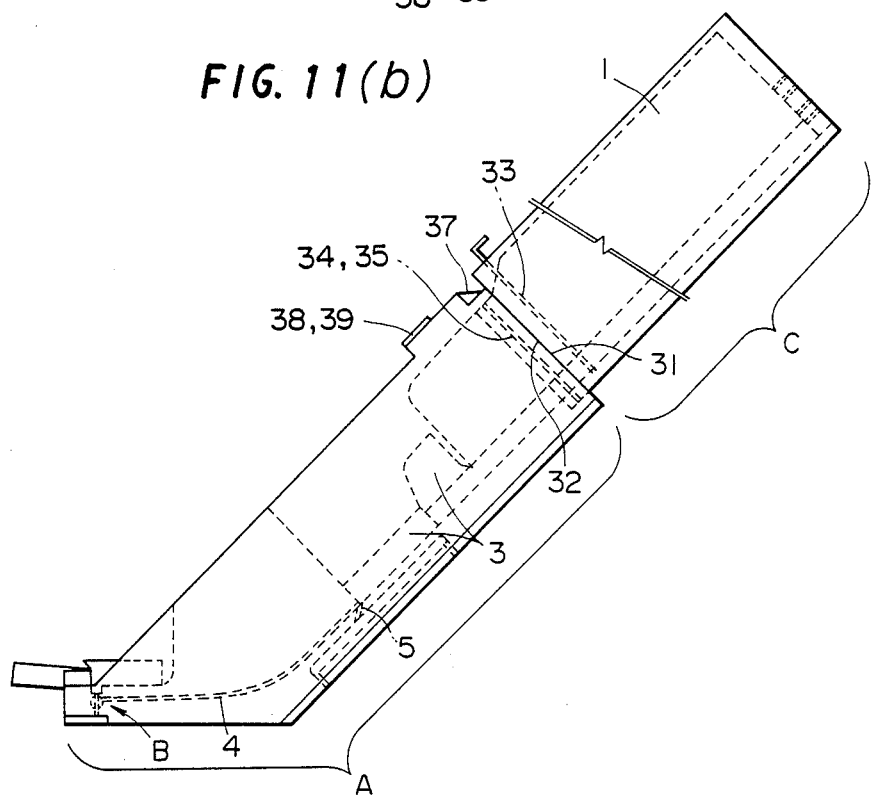
Figure 12:
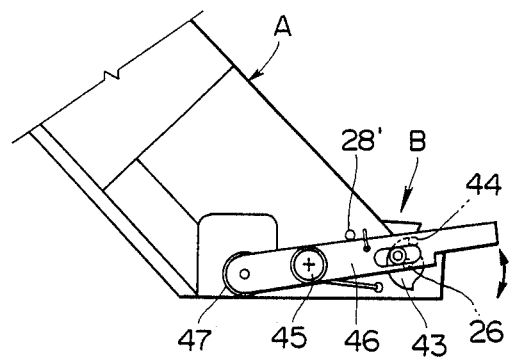
FIGS. 12(a) and 12(b) are a fragmentary plan view and a rear view of the embodiment shown in FIG. 11, respectively.
Figure 12B:
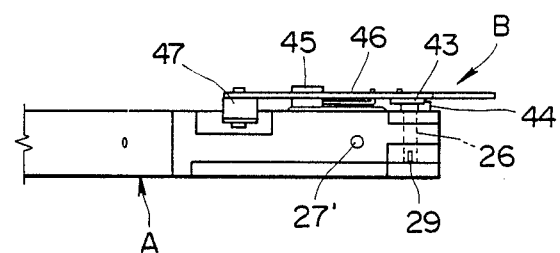
Figure 13:
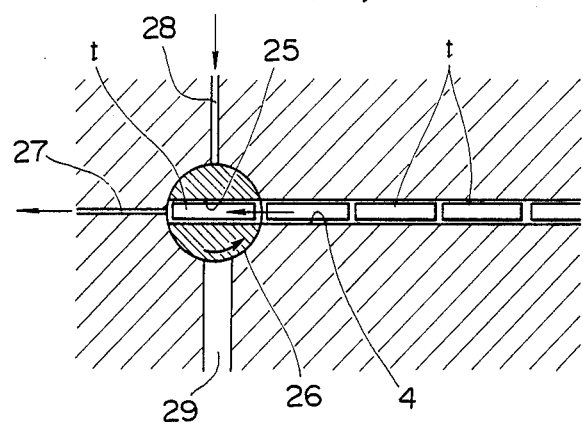
FIGS. 13(a) and 13(b) are schematic views showing operation of the embodiment shown in FIG. 11.
Figure 13:
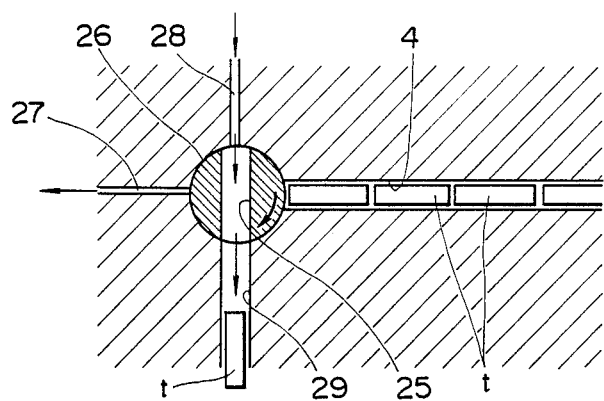

Now, a third embodiment of a chip separation and alignment apparatus of the present invention will be described with reference to FIGS. 11 to 13.

An apparatus of the third embodiment generally comprises a chip separation and alignment section A and a chip separation section B. The chip separation and alignment section A includes a chip cassette 1 generally formed into a flat rectangular box-like shape. In the chip cassette 1 are formed a chip storage chamber 2, a secondary storage chamber 3, a chip alignment hole 4, and air ejection ports 5, 9, and 14 in such a manner as described above. The chip separation section B is adapted to separate the chips t one by one and successively feed them to a subsequent step and includes a rotor 26 rotatably provided at the lower end opening 15 of the chip alignment hole 4 at a predetermined angle (for example, 90°) through a suitable means and having a charger 25, adapted to hold one chip t thereof. The chip separation section B is constructed to communicate the charger 25 with the chip alignment hole 4 and an air suction hole 27 when the rotor 26 is at a rotation starting position and communicate the charger 25 with a blowhole or air ejection hole 28 and a discharge hole 29 when it is at a rotation terminating position.

More particularly, in the chip separation section B, the pin-like rotor 26 having the charger 25 formed at one end thereof and a cam plate 43 fixed on the other end thereof is rotatably arranged at or near the lower end opening 15 of the chip alignment hole 4. The cam plate 43 is controlled to be rotated within a predetermined angle (for example, 45°) by means of a stopper 44 and suitably engaged with one end of a lever 46 pivotally supported on a shaft 45, so that the cam plate 43 may be reciprocatedly rotated within the predetermined angle due to seesaw movement of the lever 46 caused by suitable external force applied to, for example, a roller 47, resulting in the rotor 26 being reciprocatedly rotated within the predetermined angle. Reference numerals 27' and 28' designate an entrance of the air suction hole 27 and an entrance of the air ejection hole 28, respectively.

In the third embodiment described above, the chips t in the chip storage chambers 2 and 3 are separated and aligned or arranged in a row in the chip alignment hole 4 by repeat of separation of the chips due to intermittent ejection of air from the air ejection ports 5 and 9 and dropping of the chips by gravity when the rotor 26 is at the rotation starting position, the foremost one of the chips t is sucked through the air suction hole 27 to be held on the charger 25 because the rotor 26 is communicated with the chip alignment hole 4, the charger 25 and the air suction hole 27, as shown in FIG. 13(a).

Then, when the rotor 26 is rotated to the rotation terminating position by an angle of, for example, 90°, the chip t is pushed out to the discharge hole 29 by force of air ejection applied thereto through the air ejection hole 28 because the rotor 26 is communicated with the air ejection port 28, the charger 25, and the discharge hole 29 and then fed to a subsequent step, as shown in FIG. 13(b).

The rotor 26 from which the chip t has been removed is then rotated by an angle of 90° to be returned to the rotation starting position, and concurrently the next foremost chip t is held on the charger 25 by suction. Then the above-described operation is repeated at a high speed to carry out separation and supply of the chip t.

The air suction hole 27 and/or the air ejection hole 28 may constantly continuously carry out air suction and/or air ejection operations. Alternatively, they may intermittently carry out the operations depending on rotation of the rotor 26 within the predetermined angle.

In the third embodiment, continuous air suction and air ejection which are capable of exhibiting great force can be accomplished because the rotor 26 is reciprocatedly rotated within the predetermined angle (for example 90°) at a high speed (for example, several times a second) to carry out separation and supply of one chip. However, they may be carried out at a low speed as required.

Also, in the embodiment, when the rotor 26 has a diameter larger than a length of the chip t, the rotor may be provided with small venting holes which communicate with the charger 25 of the rotor 26, so that they may be communicated with the air suction hole 27 and the air ejection hole 28 when the rotor 26 is at the rotation starting and terminating positions, respectively.

As described above, the third embodiment is so constructed that only the foremost one of the chips t alignedly stored in the chip alignment hole 4 is securely held on the charger 25 of the rotor 26 by air suction and then positively discharged from the charger 25 to the discharge hole 29 by air ejection. Thus, it will be noted that the embodiment ensures separation and supply of one chip at a high speed without any trouble.

In the third embodiment, the foremost one of the chips t in the chip alignment hole 4 is held on the charger 25 by strong suction. Such construction, even when a chip to be treated fails to be positioned right before the rotor 26 or is positioned away from a predetermined position, permits the chip to be positively held on the charger 25 by strong suction because the charger 25 is communicated with the air suction hole 27 and the chip alignment hole 4 to form a straight pipe-like air passage.

Also, the embodiment has another advantage of positively discharging a chip held on the charger 25 to the discharge hole 29 and feeding it to a desired position because of exhibiting strong air, ejection.

The Fourth Embodiment

Figure 16:
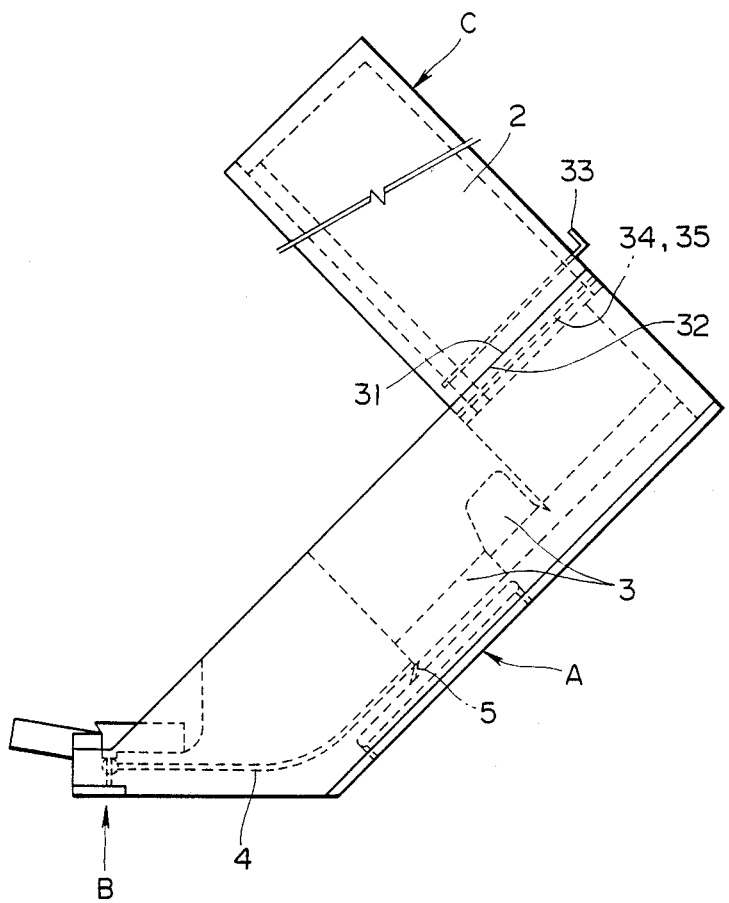
FIG. 16 is a front elevation view showing the fourth embodiment of FIG. 14 in which the cartridge-type chip case is perpendicularly connected to the chip separation and alignment section.

Now, a fourth embodiment of a chip separation and alignment apparatus according to the present invention will be described with reference to FIGS. 14 to 16.

An apparatus of the fourth embodiment generally comprises a chip separation and alignment section A and a chip separation section B. The chip separation and alignment section A includes a chip cassette 1 which is generally formed into a flat rectangular box-like shape. In the chip cassette 1 are formed a chip storage chamber 2, a secondary storage chamber 3 communicated with the chip storage chamber 2, a chip alignment hole 4 communicated with the secondary storage chamber 3, and air ejection ports 5, 9, and 14. In the embodiment fourth, the chip separation and alignment section A provided with the secondary storage chamber 3, chip alignment hole 4, and air ejection parts 5, 9, and 14 is formed separate from the chip storage chamber 2. More particularly, the chip storage chamber 2 is formed in a chip case C, which is arranged separate from the chip separation and alignment section A and detachably and exchangably connected to the section A by a suitable means. Thus, it will be noted that the chip case C is of a cartridge-type.

The cartridge-type chip case C is formed into a suitable shape like a flat rectangular box and provided at one of its side surfaces with an opening 31. The chip case C is detachably and exchangably connected to the chip separation and alignment section A in a manner to communicate the opening 31 with an opening 32 formed at a rear portion of the section A.

For example, the cartridge-type chip case C may be formed completely independently from the chip separation and alignment section A. The so-formed cartridge-type chip case C is charged with a predetermined number of chips and then sealedly covered at the opening 31 with a suitable sealing means such as a plug-in type lid 33. A plurality of and various kinds of such cartridge-type chip cases are prepared for detachable and exchangable connection to the chip separation and alignment section A. Use of the chip case C is started by removing the sealing means.

In the fourth embodiment, as described above, the cartridge-type chip case C is formed with the opening 31 sealedly closed with the sealing means such as the plug-in type lid 33 or the like. Thus, the cartridge-type chip case C which is charged with a predetermined number (for example, 1,000, 5,000, 10,000, or the like) of chips can be readily manufactured, stored, and transported. Use of the chip case C can be started by merely removing the sealing means. Interruption of the operation is easily carried out by returning the chips into the cartridge-type chip case C and then sealing the opening 31. Thus, it will be noted that the fourth embodiment is highly convenient in handling.

The cartridge-type chip case C may be horizontally or obliquely connected to the chip separation and alignment section A.

A structure for detachably and exchangably connecting the cartridge-type chip case C to the chip separation and alignment section A may be suitably constructed. For example, the opening 31 is provided adjacent to a side edge thereof with an elongated projection (or groove) 34 and correspondingly a groove (or projection) 35 is formed at a portion of the chip separation and alignment section A near a side edge of the opening 32 of the section A, so that the projection 34 may be fitted in the groove 35 to detachably and exchangably connect the case C to the section A.

Also, in the fourth embodiment, the separation and alignment section A is formed at a portion thereof above the opening 32 with a slide groove 36 and a slider 39 having a taper 37 formed at a front end thereof, and a manually operated rack 38 formed on an upper surface of a rear end thereof is slidably fitted in the groove 36 and forwardly forced by a coiled spring 40. The so-arranged slider 39 is detachably engaged at the front end with an upper portion of the cartridge-type chip case C above the opening 31 of the chip case C, resulting in the chip case C being securely held at a position with respect to the section A.

The above-described construction that the slider 39 provided above the opening 32 of the section A is engaged with the portion of the chip case C above the opening 31 effectively prevents the chip case C from being detached or deviated from the section A due to vibration or the like during the connection operation, so that the chip case C may be stably and securely held at a position with respect to the section A.

Further, the fourth embodiment may be constructed in such a manner that a suitable elastic means 41 such as a coiled spring of a predetermined length is provided at a lower portion of the chip separation and alignment section A below the opening 32 of the section A, so that the lower portion of the chip case C below the opening 31 compresses the elastic means 41 when the chip case C is horizontally connected to the separation and alignment section A to engage the slider 39 with the portion above the opening 31, and the elastic means 41 may expand to push up the chip case C by a predetermined distance when disengagement of the slider 39 is carried out.

The construction that the separation and alignment section A is provided with the elastic means 41 such as a coiled spring or the like at the portion below the opening 32 causes the elastic means 41 to be compressed when the chip case C is horizontally connected to the separation and alignment section A to engage the slider 39 with the portion of the separation and alignment section A above the opening 32 and expand to push up the chip case C when the slider 39 is disengaged from the portion for releasing the chip case C from the separation and alignment section A.

Figure 17:
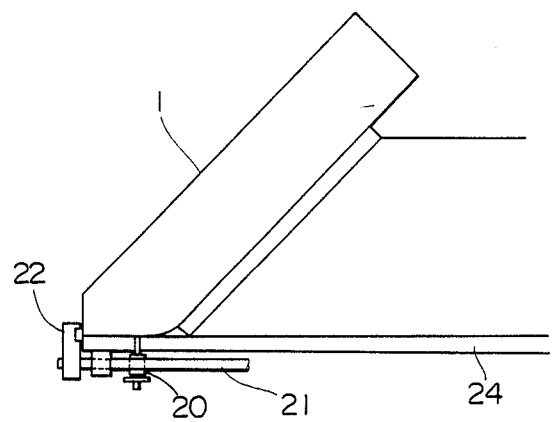
FIG. 17 is a schematic side view showing a plurality of the chip separation and alignment apparatus of the fourth embodiment arranged in a row.
Figure 18:
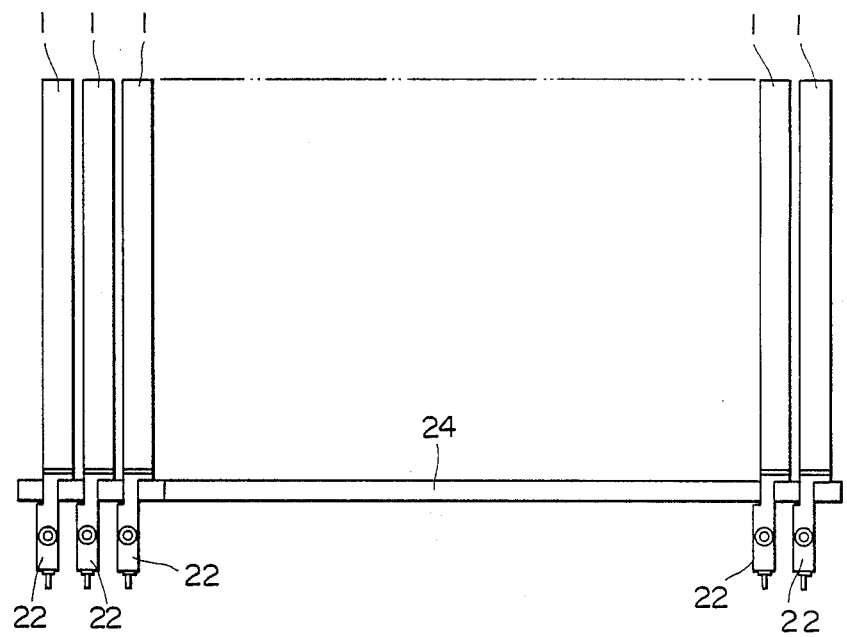
FIG. 18 is a schematic front elevation view of FIG. 17.

The chip separation and alignment apparatus (chip cassette) of the fourth embodiment as well as the conventional apparatus described above is used in a manner such that a number (tens to hundreds) of such apparatus are arranged in a row at narrow intervals of several mm (for example, 3 to 5 mm) with respect to a machine such as an automatic chip mounting apparatus, as shown in FIGS. 17 and 18. The conventional apparatus has a disadvantage that it often fails to pick out chip cases during the exchange because there is formed no space sufficient to insert fingers between the chip cases. However, the fourth embodiment effectively eliminates such a problem, because disengagement of the slider 39 causes the elastic means 41 to expand to outwardly eject the cartridge-type chip case C by a predetermined distance, to thereby facilitate grasping of the chip case C.

Thus, it will be noted that the fourth embodiment permits the cartridge-type chip case C to be readily exchanged while the chip separation and alignment section A is fixedly kept, so that the exchange may be readily carried out at a high speed. Also, when the exchange takes place while chips remain in the secondary storage chamber 3 a continuous supply of chips is ensured without interruption.

The chip separation and alignment section A constitutes an essential part which carries out separation and alignment of chips and separation and supply of the chips one by one in the chip separation and alignment apparatus or chip cassette. Accordingly, the section is required to be formed with high accuracy and the manufacturing cost depends on the section. On the contrary, the cartridge-type chip case is readily manufactured and inexpensive.

Thus, the construction of the fourth embodiment that the chip separation and the alignment section A and cartridge-type chip case C are formed independent from each other and exchangably to use the chip case C reduces the number of the precise and expensive chip separation and alignment sections A required, to thereby accomplish a decrease in manufacturing cost.

For example, standardization of the cartridge-type chip case permits its exchangable use without depending on a manufacturer. This is also applicable to the chip separation and alignment section A. Also, when the chip alignment hole portion of the separation and alignment section A is formed to be exchangable depending on the shape and dimensions of a chip, the section may be commonly used for a wide variety of chips by merely exchanging the chip alignment hole section.

While preferred embodiments of the invention have been described with a certain degree of particularity with reference to the drawings, obvious modifications and variations are possible in the light of the above teachings. It is therefore to be understood that, within the scope of the appended claims, the invention may be practiced otherwise than as specifically described.

What is claimed is:

1. A chip separation and alignment apparatus comprising:
    (a) a principal chip storage chamber which, in use, contains a relatively large number of chips, said principal chip storage chamber having at least one air purge hole therein near the top thereof;
    (b) a secondary chip storage chamber which, in use, contains a relatively small number of chips, and secondary chip storage chamber being located beneath said principal chip storage chamber and being separated therefrom by a gate that defines the lower opening of a passageway sized and shaped to permit a small number of chips to pass abreast from said principal chip storage chamber to said secondary chip storage chamber;
    (c) first means for intermittently introducing blasts of pressurized air into said secondary chip storage chamber so as to scatteringly separate the chips in said secondary and primary chip storage chambers during alternating first periods, after which the chips fall back into the lower portions of said secondary and primary chip storage chambers under the force of gravity during alternating second periods;
    (d) a control plate having an upper surface, said control plate being disposed in said secondary chip storage chamber beneath the opening of said passageway into said secondary chip storage chamber and being sized, shaped, and positioned so that its upper surface supports a small number of chips during the alternating second periods and so that said control plate and said gate cooperate to prevent the chips from filling said secondary chip storage chamber during the alternating second periods;
    (e) a chip alignment hole projecting downwardly from said secondary chip storage chamber, said chip alignment hole being sized and shaped to pass the chips one after the other in linear array; and
    (f) second means for alternatingly blocking the lower end of said chip alignment hole and permitting one of the chips therein to exit said chip alignment hole and pass to a subsequent step.

2. A chip storage and alignment apparatus as recited in claim 1 wherein said first means comprise:
    (a) a first air ejection port that communicates with the bottom of said secondary chip storage chamber and
    (b) a second air ejection port that communicates with said secondary chip storage chamber adjacent said control plate.

3. A chip storage and alignment apparatus as recited in claim 1 wherein said second means comprise:
    (a) a rod disposed at the downstream end of said chip alignment hole;
    (b) a groove in said rod sized and shaped to receive a single one of the chips; and
    (c) third means for moving said rod back and forth between a first position in which said groove is positioned to receive one of the chips and a second position in which said rod blocks the downstream end of said alignment hole and said groove is positioned so that the chip therein can pass to a subsequent step.

* * * * *